United States Patent
Difonzo et al.

(10) Patent No.: US 10,006,974 B2
(45) Date of Patent: Jun. 26, 2018

(54) AUTOMATED SYSTEM FOR MAGNET QUALITY MEASUREMENTS

(71) Applicant: Apple Inc., Cupertino, CA (US)

(72) Inventors: John C. Difonzo, Emerald Hills, CA (US); Maurizio Bertoldo, Oleggio (IT)

(73) Assignee: Apple Inc., Cupertino, CA (US)

(*) Notice: Subject to any disclaimer, the term of this patent is extended or adjusted under 35 U.S.C. 154(b) by 0 days. days.

(21) Appl. No.: 15/272,352

(22) Filed: Sep. 21, 2016

(65) Prior Publication Data

US 2017/0082699 A1  Mar. 23, 2017

Related U.S. Application Data

(60) Provisional application No. 62/222,085, filed on Sep. 22, 2015.

(51) Int. Cl.
| | |
|---|---|
| *B03C 1/00* | (2006.01) |
| *G01R 33/12* | (2006.01) |
| *G01R 33/038* | (2006.01) |

(52) U.S. Cl.
CPC ......... *G01R 33/12* (2013.01); *G01R 33/0385* (2013.01)

(58) Field of Classification Search
CPC .......................... G01R 33/12; G01R 33/0385
USPC ................ 209/552, 567, 214, 215, 684–686
See application file for complete search history.

(56) References Cited

U.S. PATENT DOCUMENTS

| | | | | |
|---|---|---|---|---|
| 1,906,551 A | * | 5/1933 | De Forest | G01L 1/125 324/209 |
| 4,058,763 A | * | 11/1977 | Steingroever | G01R 33/14 209/567 |
| 4,385,699 A | * | 5/1983 | Ashina | B07C 5/3404 209/538 |
| 4,604,573 A | * | 8/1986 | Eyermann | G01R 33/12 324/205 |
| 4,673,077 A | * | 6/1987 | Taniguchi | B65G 47/1457 198/393 |

(Continued)

FOREIGN PATENT DOCUMENTS

| | | |
|---|---|---|
| CN | 103364755 A | 10/2013 |
| CN | 204347227 U * | 5/2015 |

(Continued)

*Primary Examiner* — Terrell H Matthews
(74) *Attorney, Agent, or Firm* — Dickinson Wright RLLP (57) ABSTRACT

An automated magnet quality measurement system includes a magnet measuring component and an automated magnet moving component. The magnet measuring component can be configured to measure EMF for a plurality of magnets. The automated magnet moving component can move each of the plurality of magnets into and out of the magnet measuring component without requiring any manual intervention, with only one of the plurality of magnets being within the magnet measuring component at a given time. The magnet measuring component can be a Helmholtz coil and the automated magnet moving component can be a rotating disk. The overall system can also include a loading system configured to load each of the magnets onto the automated magnet moving component on an individual and sequential basis, and a sorting system configured to sort the magnets based upon their EMF measurements.

20 Claims, 6 Drawing Sheets

(56) References Cited

U.S. PATENT DOCUMENTS

| | | | | |
|---|---|---|---|---|
| 5,518,123 A * | 5/1996 | Jin | ............................ | B07C 5/344 209/571 |
| 2007/0096857 A1 * | 5/2007 | Webb | .................. | G01N 27/9013 335/299 |

FOREIGN PATENT DOCUMENTS

| | | | | |
|---|---|---|---|---|
| DE | 19637732 A1 * | 4/1998 | ............. | G01R 33/12 |
| JP | 09294355 A * | 11/1997 | | |

* cited by examiner

AUTOMATED SYSTEM FOR MAGNET QUALITY MEASUREMENTS

CROSS-REFERENCE TO RELATED APPLICATION

This application claims the benefit of U.S. Provisional Patent Application No. 62/222,085, filed on Sep. 22, 2015, which is incorporated by reference herein in its entirety for all purposes.

FIELD

The described embodiments relate generally to magnet processing. More particularly, the described embodiments relate to measuring properties of multiple magnets efficiently.

BACKGROUND

Magnets are typically tested by measuring their produced magnetic flux. This is often done in a test box where numerous steps need to be performed. For example, a single magnet is placed on a set plate, a search coil matching the size of the magnet is lowered onto the magnet, a nearby circuit measures the electromotive force ("EMF") of the magnet, its magnetic flux is calculated therefrom, the search coil is then raised up, the single magnet is removed, and another single magnet is set in its place for the process to repeat. This flux measuring process is fine, but it tends to be slow, often requires human interaction for various tasks, and can involve the use of multiple search coils to match magnets of varying sizes. These and other factors can result in flux measurement values that are not standardized or exact, which can lead to other problems in a scaled manufacturing environment. While magnetic flux measuring processes have thus worked well in the past, there can be room for improvement. Accordingly, there is a need for improved magnetic property or quality measuring systems and processes that are more efficient.

SUMMARY

Representative embodiments set forth herein disclose various structures, methods, and features thereof for the disclosed automated magnet quality measurement systems. In particular, the disclosed embodiments set forth automated systems that measure magnetic flux of multiple potential magnetic parts and sort the measured parts as accepted or rejected accordingly.

According to various embodiments, automated magnet quality measurement systems are configured to measure magnet qualities and process magnets accordingly, such as in a manufacturing environment. An exemplary automated magnet quality measurement system can include at least: 1) a magnet measuring component, and 2) a magnet moving component. The magnet measuring component can be configured to measure EMF for a plurality of magnets. The magnet moving component can move automatically each of the plurality of magnets into and out of the magnet measuring component without requiring any manual intervention, with only one of the plurality of magnets being within the magnet measuring component at a given time. The magnet measuring component can be a Helmholtz coil and the automated magnet moving component can be a rotating disk. The overall system can also include a loading system configured to load each of the magnets onto the automated magnet moving component on an individual and sequential basis, and a sorting system configured to sort the magnets based upon their EMF measurements.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described will become apparent from the following Detailed Description, Figures, and Claims.

Other aspects and advantages of the embodiments described herein will become apparent from the following detailed description taken in conjunction with the accompanying drawings which illustrate, by way of example, the principles of the described embodiments.

BRIEF DESCRIPTION OF THE DRAWINGS

The included drawings are for illustrative purposes and serve only to provide examples of possible structures and methods for the disclosed automated magnet quality measurement systems. These drawings in no way limit any changes in form and detail that may be made to the embodiments by one skilled in the art without departing from the spirit and scope of the embodiments. The embodiments will be readily understood by the following detailed description in conjunction with the accompanying drawings, wherein like reference numerals designate like structural elements.

DETAILED DESCRIPTION

Magnetic flux measuring systems are a common tool to analyze magnetic parts, such as to accept or reject parts for manufacturing uses. Many such magnetic flux measuring systems can be slow, cumbersome, and/or inaccurate, however, such that it can be desirable to provide improved magnetic flux measuring systems for large scale manufacturing environments.

The embodiments set forth herein thus provide various structures and methods for providing automated magnet quality measurement systems that measure the magnetic flux of multiple potential magnetic parts and sort the measured parts as accepted or rejected accordingly. An exemplary automated magnet quality measurement system can include at least a magnet measuring component and an automated magnet moving component. The magnet measuring component can be configured to measure EMF for a plurality of magnets. The automated magnet moving component can move each of the plurality of magnets into and out of the magnet measuring component without requiring any manual intervention, with only one of the plurality of magnets being within the magnet measuring component at a given time.

In various detailed embodiments, the magnet measuring component can be a Helmholtz coil and the automated magnet moving component can be a rotating disk. The overall system can also include a loading system configured to load each of the magnets onto the automated magnet moving component on an individual and sequential basis, and a sorting system configured to sort the magnets based upon their EMF measurements. A processor can facilitate the automated sorting of magnets in some embodiments.

The foregoing approaches provide various structures and methods for the disclosed automated magnet quality measurement systems. A more detailed discussion of these structures, methods, and features thereof is set forth below and described in conjunction with FIGS. 1-6, which illustrate detailed diagrams of devices and components that can be used to implement these structures, methods, and features.

Figure 1A:
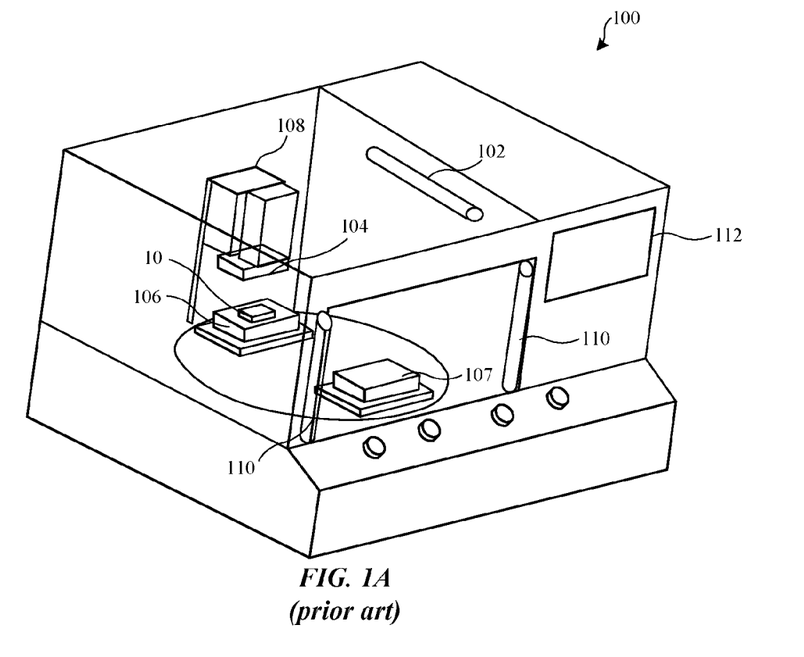
FIG. 1A illustrates in front perspective view an exemplary test box suitable for measuring the magnetic flux of a magnet.

Turning first to FIG. 1A, an exemplary test box suitable for measuring the magnetic flux of a magnet is illustrated in front perspective view. Test box 100 can include various components, such as a lamp 102, one or more search coils 104, one or more set plates 106, 107, electronic circuitry 108, one or more optic curtains 110, and a display 112, among other items. A magnet 10 can be tested by measuring the flux it produces. Since it is not possible to directly measure magnetic flux, this quality can be determined by moving the magnet 10 relative to an electrical coil, such as search coil 104. From the EMF generated by the magnet 10 in the search coil 104, the magnetic flux of the magnet 10 can be calculated. In test box 100, search coil 104 can be lowered onto the magnet 10 while the magnet is located on set plate 106. The electronic circuitry 108 within test box 100 measures the EMF, calculates the flux, and shows the value of the flux on the display 112. After the measurement, the search coil 104 can be raised back up and the next magnet (not shown) on the front set plate 107 can be rotated under the search coil 104 for the next measurement. This system works, but has several disadvantages.

Because the movement of the search coil 104 is perpendicular to the part flow and must be retracted, the cycle time for the measurement can be slow. The test box 100 also requires constant manual intervention, such as a human operator feeding and retrieving parts. The test box 100 is also dependent on the human operator to read the display accurately and decide whether the magnet 10 is good or bad. Further, the size of search coil 104 must be matched to the size of the magnet 10 or at least be close to it, such that different sized magnets require different sized search coils 104. Where each new magnet 10 requires a different search coil 104 or even the development of a new search coil, this can take a long time. Because a given search coil 104 can be customized, the amount of EMF that it produces with a magnet 10 is unique to its design. Thus, it can be very difficult to standardize the measurement value and trace it back to basic physical laws and effects, and the results of each individual measurement can be difficult to check in an independent lab.

Figure 1B:
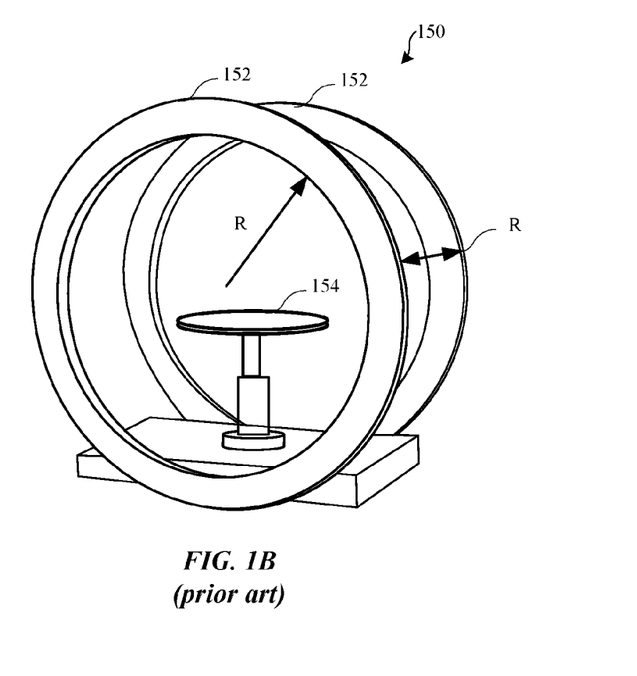
FIG. 1B illustrates in front perspective view an exemplary Helmholtz coil.

FIG. 1B illustrates in front perspective view an exemplary Helmholtz coil. Helmholtz coil 150 can represent a standard piece of equipment in many labs that deal with magnetism. Like other similar devices, Helmholtz coil 150 can include two electrical coils 152 of radius "R" that are spaced apart by a distance "R." A stage 154 for measuring items within the Helmholtz coil 150 may or may not be present, as may be desired. As is generally known, this arrangement creates a volume between the coils 152 of a uniform field strength, such that a magnet put into or removed from that volume will produce an EMF that is easy to measure and calculate. The simplicity of the geometry also means that the physics is simple and easy to model.

Figure 2A:
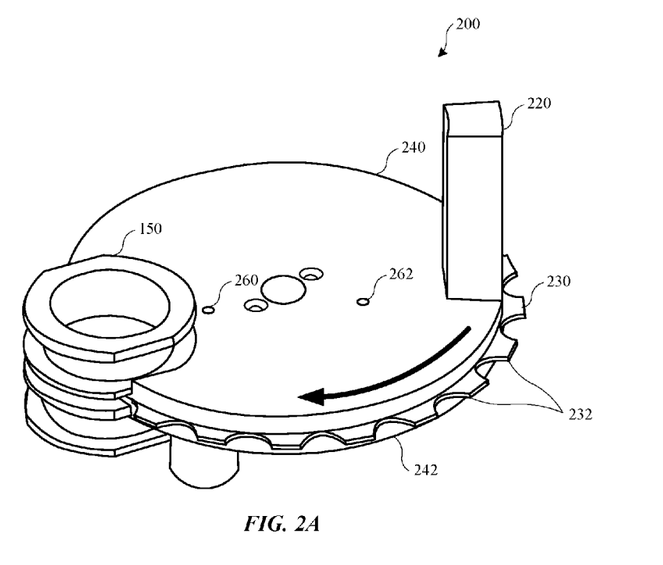
FIG. 2A illustrates in front perspective view an exemplary magnet quality measurement system according to various embodiments of the present disclosure.

FIG. 2A illustrates in front perspective view an exemplary magnet quality measurement system according to various embodiments of the present disclosure. Automated magnet quality measurement system 200 can include a loading system 220, a Helmholtz coil 150 turned on its side or other magnet measuring component, and a rotating disk 230 or other automated magnet moving component that transports magnets under test in and out of the Helmholtz coil 150 or other magnet measuring component. Rotating disk 230 can be configured to rotate in a clockwise direction, as shown, and can be situated against or between one or more fixed supports, such as upper support 240 and lower support 242, which may not rotate with the rotating disk 230. Other types of motion are also possible. In various embodiments, rotating disk 230 can include a plurality of cavities or recesses 232, each of which can be configured to contain or hold a magnet or other work piece therein.

One or more sensors may also be used with automated magnet quality measurement system 200, such as a reading sensor 260 and a reset sensor 262. Reading sensor 260 can be, for example, a fluxmeter configured to read the EMF of a magnet passing through Helmholtz coil 150, while reset sensor 262 can be configured to reset the reading sensor 260 and/or one or more other system components when there is no magnet within the Helmholtz coil. Other conditions may be used to trigger reset sensor 262 as well, as will be readily appreciated. Additional system components can include circuitry adapted to send signal data to an associated processor, as well as the processor itself. Further system components can include automated release mechanisms at each of cavities or recesses 232, as well as one or more bins for accepting tested magnets. This can include, for example, an accepted magnet bin and a rejected magnet bin.

In various embodiments, automated magnet quality measurement system 200 can be configured to measure the magnetic moment of magnetized permanent magnets. The magnetic moment for a given magnet can be measured by Helmholtz coil 150, which can be accomplished by using the procedure described by International Standard IEC 60404-14, for example. Helmholtz coil 150 can be connected to a fluxmeter, and the magnet to be measured can be placed within a central volume of the Helmholtz coil 150, such as by moving the magnet through the Helmholtz coil 150 while the magnet is within a cavity 232 on rotating disk 230 as it passes therethrough. Moving the magnet far from this position, where its magnetic field has no more influence on the reading creates a flux variation $\Delta\Phi$. The magnetic moment M of the magnet is proportional to $\Delta\Phi$:

$$M = K_H \cdot \Delta\Phi$$

In open circuit conditions, the magnetic moment of the magnet is the product of its volume V and the magnetic polarization $J_d$ of the working point:

$$M = J_d \cdot V$$

For anisotropic magnets, $J_d$ is very similar to the residual induction Br. The residual induction is a function of the demagnetization factor (loading line) and of the slope of the curve. The flux variation $\Delta\Phi$ can be created in different ways, such as, for example, starting with the magnet in the coil and ending with the magnet far from the coil, or starting with the magnet far from the coil and ending with the magnet in the coil, or alternatively starting with the magnet far from the coil and making a path passing through the center and ending with the magnet far from the coil. In this case, the $\Delta\Phi$ to be considered is the maximum value of flux registered across all movement of the given magnet.

Figure 2B:
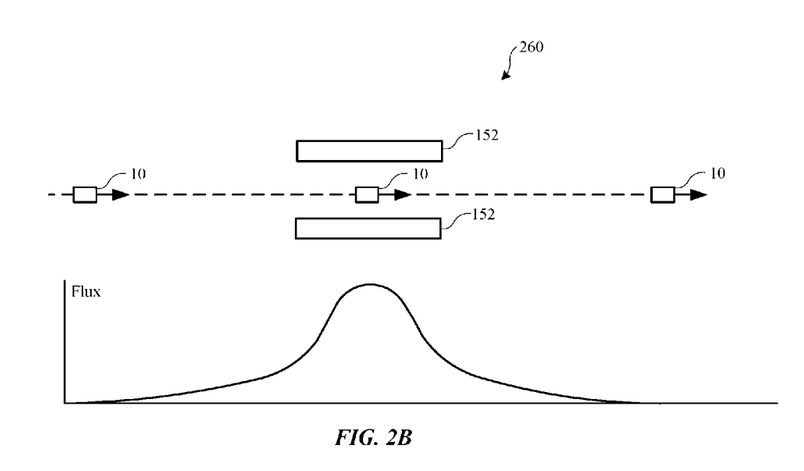
FIG. 2B illustrates an exemplary graph of a measured amount of magnetic flux as a given magnet passes through the Helmholtz coil in the magnet quality measurement system of FIG. 2A according to various embodiments of the present invention.

FIG. 2B illustrates an exemplary graph of a measured amount of magnetic flux as a given magnet passes through the Helmholtz coil in the magnet quality measurement system of FIG. 2A according to various embodiments of the present invention. As shown in reading sensor 260, a given magnet 10 can pass between coils 152 that together form a Helmholtz coil. Such passage can be from left to right, or from right to left, with equal effectiveness. The graph below reading sensor 260 generally depicts that the measured flux for magnet 10 increases as the magnet 10 nears the central volume within coils 152, and then decreases as magnet 10 moves away from that central volume. The maximum value of the measured flux effectively represents the flux for magnet 10. This value can be measured in a similar manner for all magnets passing through the coils 152 that together form a Helmholtz coil.

Figure 3A:
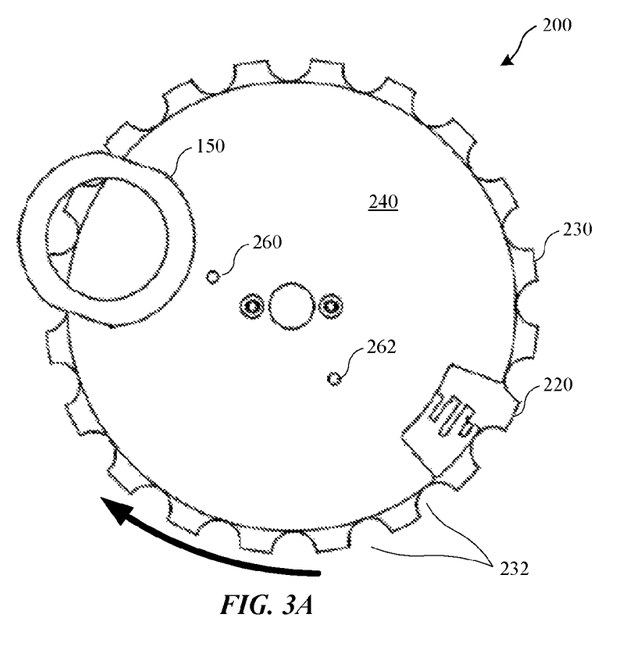
FIG. 3A illustrates in top plan view the magnet quality measurement system of FIG. 2A according to various embodiments of the present disclosure.
Figure 3B:
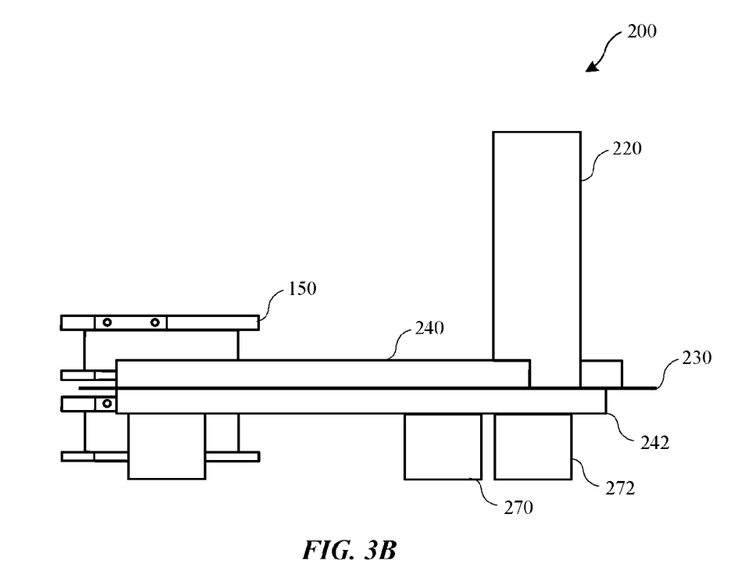
FIG. 3B illustrates in side elevation view the magnet quality measurement system of FIG. 2 according to various embodiments of the present disclosure.

FIG. 3A illustrates in top plan view the magnet quality measurement system of FIG. 2A according to various embodiments of the present disclosure, and FIG. 3B illustrates in side elevation view the magnet quality measurement system of FIG. 2A according to various embodiments of the present disclosure. Again, automated magnet quality measurement system 200 can include a loading system 220 arranged vertically above an upper support 240 and with respect to recesses 232 in a rotating disk 230. The rotating disk 230 can be situated between upper support 240 and lower support 242, and can transport magnets to and through a Helmholtz coil 150. A reading sensor 260 and reset sensor 262 can be used to read each magnet and reset the system as each magnet passes through the Helmholtz coil 150. In addition, an accepted magnet bin 270 and a rejected magnet bin 272 can be included at the end of a path that each magnet takes rotating with rotating disk 230.

Figure 4A:
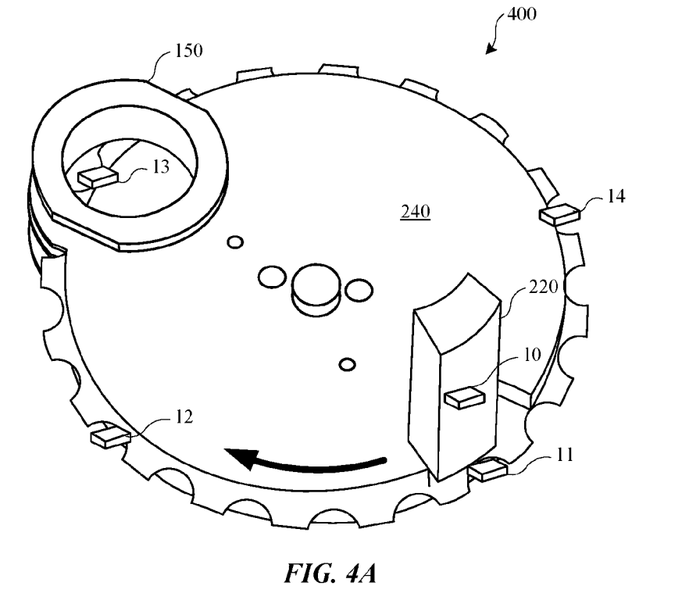
FIG. 4A illustrates in top perspective view an exemplary partial rotational operation of the magnet quality measurement system of FIG. 2A according to various embodiments of the present disclosure.

FIG. 4A illustrates in top perspective view an exemplary partial rotational operation of the magnet quality measurement system of FIG. 2A according to various embodiments of the present disclosure. Arrangement 400 depicts various positions of a magnet 10 during operation of the magnet quality measurement system. In various embodiments, a column of multiple magnets to be measured, which can include magnet 10, can be inserted in the loading system 220. The column can end on a flat surface of the rotating disk 230 and/or upper support 240. The rotating disk 230 can have teeth for easy handling, between which are a plurality of cavities or recesses 232, as noted above. In various embodiments, one or both of upper support 240 and lower support 242 can be transparent, which can allow a user or observer to see inside of the rotating disk 230, as well as the exact magnet position.

A given magnet 10 stacked in the loading system 220 can fall into a recess 232 in the rotating disk 230, which can take place as the rotating disk 230 rotates beneath the loading system 220. In various embodiments, the lowest magnet 10 stacked within loading system 220 can fall to a position 11 at a given recess 232 when the recess is directly below the loading system 220. The rotating disk 230 can then transport the magnet away from the other magnets in the loading system 220 and toward the Helmholtz coil 150. As the magnet moves in this manner, such as toward a position 12, the reset sensor 262 in or at the rotating disk 230 can trigger the fluxmeter electronics to reset and get ready for a measurement of the magnet. At this point, the flux of the magnet is zero with respect to the Helmholtz coil 150. Next, the magnet continues to move with the rotation of rotating disk 230 until it enters the Helmholtz coil 150, such as at position 13, where the magnetic flux increases to a maximum and then decreases, all while the fluxmeter performs a reading on the magnet. The magnet is then rotated out of the Helmholtz coil 150 and continues to an unloading or sorting position 14.

Figure 4B:
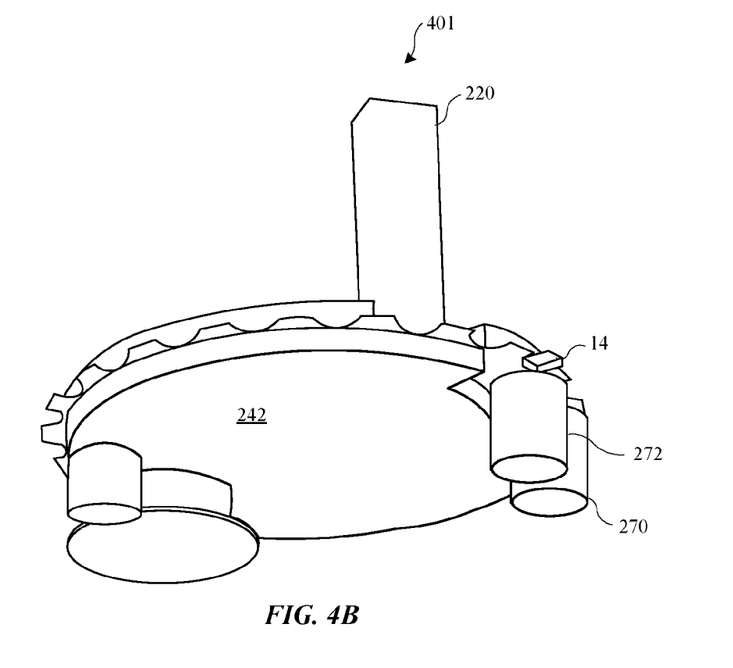
FIG. 4B illustrates in bottom perspective view an exemplary continued rotational operation of the magnet quality measurement system from FIG. 4A according to various embodiments of the present disclosure.

FIG. 4B illustrates in bottom perspective view an exemplary continued rotational operation of the magnet quality measurement system from FIG. 4A according to various embodiments of the present disclosure. Continuing with the rotation of rotating disk 230, the magnet is brought to unloading or sorting position 14. This unloading or sorting position 14 can include an empty part of the lower support 242, which can allow the magnet to fall or drop when released from its recess 232, which can be into an accepted magnet bin 270 or a rejected magnet bin 272 depending upon the reading for that magnet. In various embodiments, the recess 232 that is configured to hold and rotate the magnet with rotating disk 230 can also be designed with a mechanism that releases the magnet. Such a release mechanism can be actuated at an appropriate location above the proper bin 270, 272, upon receiving a signal from an associated processor. Such an associated processor can also be configured to receive the reading for the magnet from the fluxmeter, such that the processor actuates the release mechanism in each recess 232 in order to sort accepted magnets from rejected magnets and deposit them in separate bins.

As will be readily appreciated, there are numerous advantages of the disclosed automated magnet quality measurement system 200. The system does not require a human operator to load and unload each separate magnet, nor does the system require a human operator to change coils or read measurements to accept or reject magnets individually. Accordingly, cycle time can be decreased. Further, the coil does not need to be custom designed for each new magnet, such that the same Helmholtz coil arrangement can be used so long as each magnet fits within the uniform volume of the Helmholtz coil. Measurements made with the disclosed system can be checked in any well-equipped laboratory, and it can be relatively simple to model the physics using standard calculations for simple known geometries, such that a design engineer can predict what the device will read.

Figure 5:
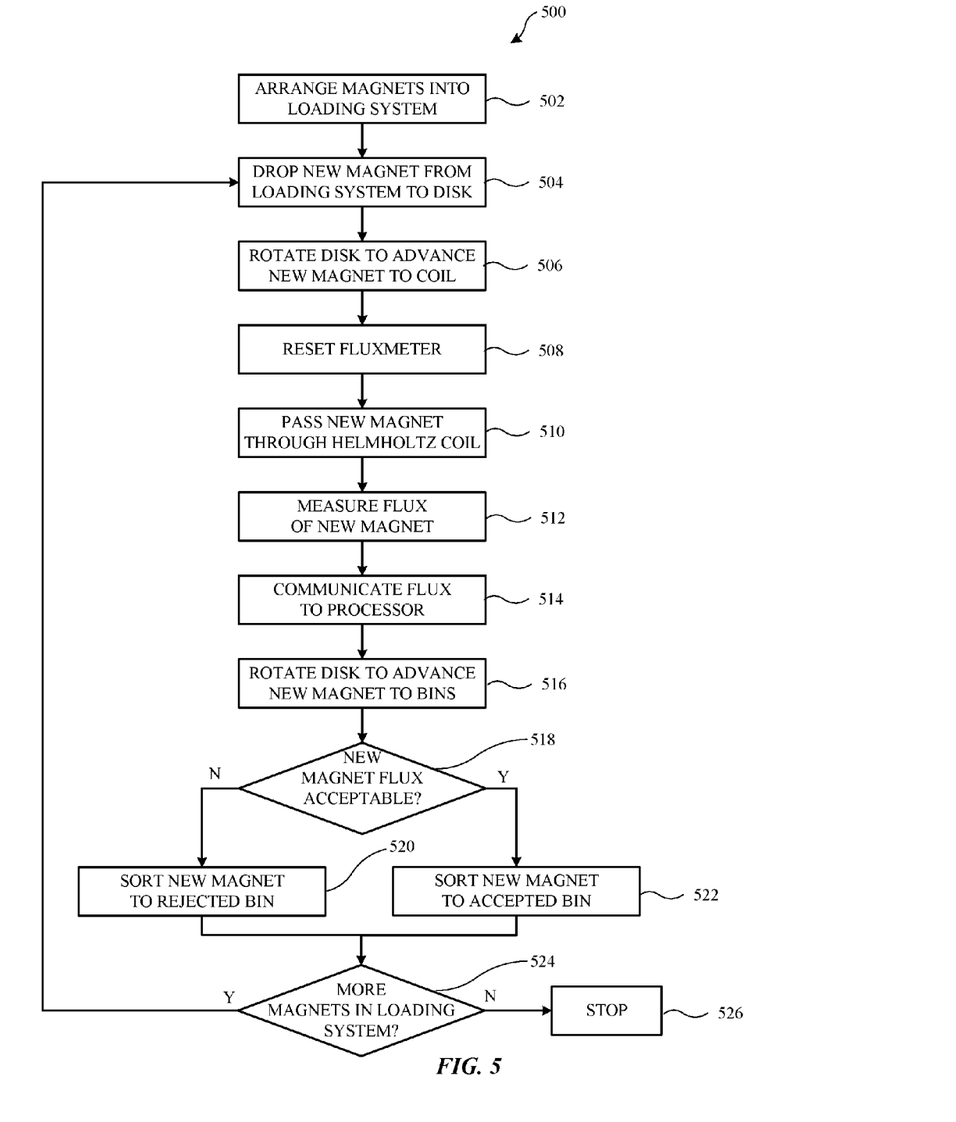
FIG. 5 illustrates a flowchart of an exemplary method for automatically processing a plurality of magnets according to various embodiments of the present disclosure.

FIG. 5 illustrates a flowchart of an exemplary method for automatically processing a plurality of magnets according to various embodiments of the present disclosure. Method 500 can be carried out by one or more processors or other controllers that may be associated with an automated magnet quality measurement system. Method 500 can start at a process step 502, where a plurality of magnets are arranged into a loading system. At the next process step 504, a new magnet can be dropped from the loading system to an automated magnet moving component, which can be, for example, a rotating disk. At process step 506, the rotating disk or other automated magnet moving component can be moved to advance the new magnet toward a magnet measuring component. Again, such a magnet measuring component can be a device that measures EMF or magnetic flux for the magnet. In various embodiments, this can be a Helmholtz coil, for example. At process step 508, a fluxmeter or other magnet measuring component or sensor can be reset, and at process step 510, the new magnet can be passed through the Helmholtz coil or other magnet measuring component.

At process step 512, the magnetic flux of the new magnet can be measured, and at process step 514, this measured magnetic flux can be communicated to a processor. At a following process step 516, the rotating disk or other automated magnet moving component can be rotated or otherwise moved to advance the new magnet to an unload or sorting position, such as toward sorting bins. At a decision step 518, an inquiry can be made as to whether the measured magnetic flux of the new magnet is acceptable. If not, then the method can continue to process step 520, where the new magnet is sorted to a rejected magnet bin. If the measured magnetic flux is acceptable, however, then the method can continue to process step 522, where the new magnet is sorted to an accepted magnet bin. After either outcome, the method can continue to a decision step 524, where an inquiry can be made as to whether there are more magnets in the loading system. If so, then the method can revert to process step 504, where steps 504 through 524 can then be repeated. If there are no magnets left, however, then the method can then reach a stop step 526.

For the foregoing flowchart, it will be readily appreciated that not every step provided is always necessary, and that further steps not set forth herein may also be included. For example, added steps that involve calibrating the Helmholtz coil or other specific magnetic sensor(s) may be added. Also, steps that provide more detail with respect to accepting and sorting tested magnets may also be added. Furthermore, the exact order of steps may be altered as desired, and some steps may be performed simultaneously.

Figure 6:
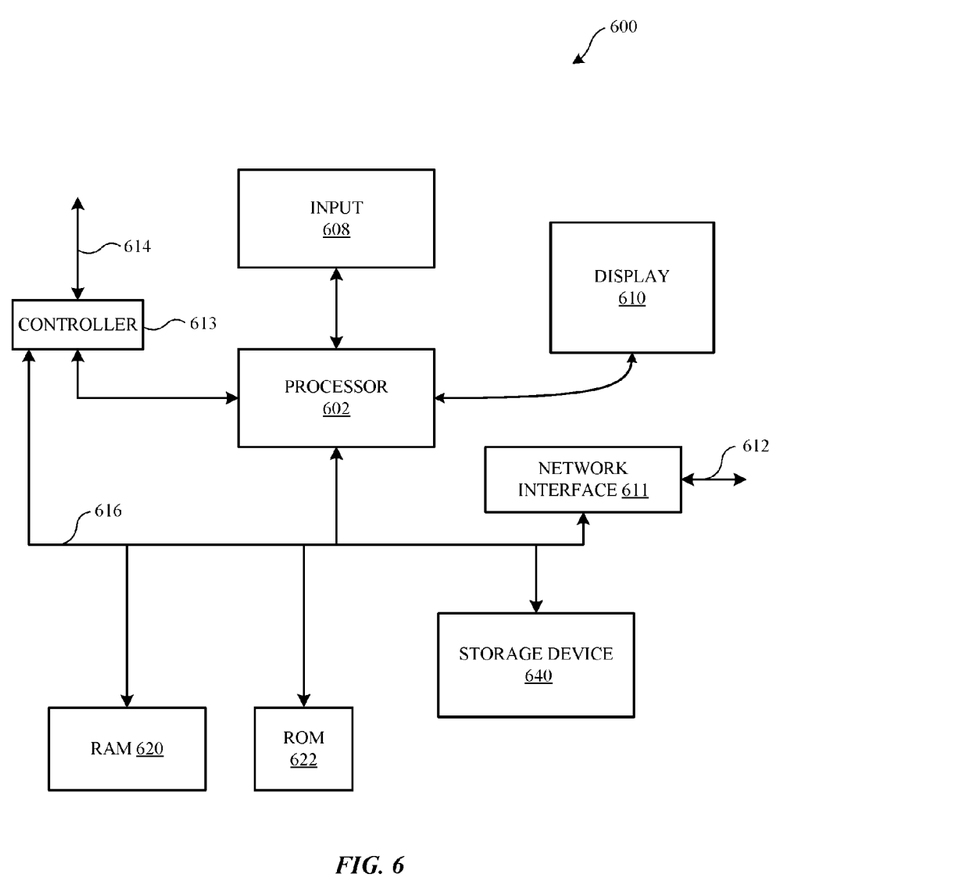
FIG. 6 illustrates in block diagram format an exemplary computing device that can be used to implement the various components and techniques described herein according to various embodiments of the present disclosure.

FIG. 6 illustrates in block diagram format an exemplary computing device 600 that can be used to implement the various components and techniques described herein, according to some embodiments. In particular, the detailed view illustrates various components that can be included in an electronic device suitable for operating an automated magnet quality measurement system, such as that which is shown in FIG. 2A. As shown in FIG. 6, the computing device 600 can include a processor 602 that represents a microprocessor or controller for controlling the overall operation of computing device 600. The computing device 600 can also include a user input device 608 that allows a user of the computing device 600 to interact with the computing device 600. For example, the user input device 608 can take a variety of forms, such as a button, keypad, dial, touch screen, audio input interface, visual/image capture input interface, input in the form of other sensor data, etc. Still further, the computing device 600 can include a display 610 (screen display) that can be controlled by the processor 602 to display information to the user (for example, a movie or other AV or media content). A data bus 616 can facilitate data transfer between at least a storage device 640, the processor 602, and a controller 613. The controller 613 can be used to interface with and control different equipment through and equipment control bus 614. Such equipment can include, for example, an automated magnet quality measurement system and sensors for same, such as that which is disclosed herein. The computing device 600 can also include a network/bus interface 611 that couples to a data link 612. In the case of a wireless connection, the network/bus interface 611 can include a wireless transceiver.

The computing device 600 can also include a storage device 640, which can comprise a single disk or a plurality of disks (e.g., hard drives), and includes a storage management module that manages one or more partitions within the storage device 640. In some embodiments, storage device 640 can include flash memory, semiconductor (solid state) memory or the like. The computing device 600 can also include a Random Access Memory (RAM) 620 and a Read-Only Memory (ROM) 622. The ROM 622 can store programs, utilities or processes to be executed in a non-volatile manner. The RAM 620 can provide volatile data storage, and stores instructions related to the operation of the computing device 600.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium. The computer readable medium is any data storage device that can store data which can thereafter be read by a computer system. Examples of the computer readable medium include read-only memory, random-access memory, CD-ROMs, DVDs, magnetic tape, hard disk drives, solid state drives, and optical data storage devices. The computer readable medium can also be distributed over network-coupled computer systems so that the computer readable code is stored and executed in a distributed fashion.

The foregoing description, for purposes of explanation, uses specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An automated measurement system for measuring a magnetic quality of a magnet in a production environment, the automated measurement system comprising:
   a magnet measuring component having coils that define a central volume, wherein, when energized, the coils generate a magnetic field having a generally uniform magnetic field strength within the central volume;
   a positioning mechanism that positions the magnet within the central volume such that, when the coils are energized, the magnet is exposed to a maximum magnetic flux; and
   an electromotive force ("EMF") measurement device that measures an EMF of the magnet in accordance with the maximum magnetic flux, wherein subsequent to measuring the EMF of the magnet, the positioning mechanism directs the magnet to an appropriate bin according to the measured EMF of the magnet.

2. The automated measurement system of claim 1, wherein the central volume is configured to accommodate magnets of different sizes.

3. The automated measurement system of claim 1, wherein the coils are a Helmholtz coil.

4. The automated measurement system of claim 1, wherein the positioning mechanism includes a rotating disk.

5. The automated measurement system of claim 4, wherein the rotating disk includes a recess that is configured to carry the magnet.

6. The automated measurement system of claim 4, wherein the rotating disk is configured to position the magnet within the central volume of the magnet measuring component at a given time.

7. The automated measurement system of claim 6, further comprising:
a reset sensor positioned on the rotating disk, wherein the reset sensor is configured to reset the magnet measuring component prior to measuring the EMF of the magnet.

8. The automated measurement system of claim 1, further comprising:
a sorting system configured to compare the measured EMF of the magnet to a predetermined EMF value.

9. The automated measurement system of claim 8, wherein the appropriate bin is selected from a first bin configured for accepting magnets having the measured EMF that satisfies the predetermined EMF value and a second bin configured for rejecting magnets having the measured EMF that does not satisfy the predetermined EMF value.

10. The automated measurement system of claim 8, wherein the sorting system includes a release mechanism.

11. The automated measurement system of claim 10, further comprising:
a processor in communication with the magnet measuring component and in communication with the release mechanism, wherein the processor is configured to send a signal to the release mechanism to release the magnet based on the EMF of the magnet that is communicated to the processor by the magnet measuring component.

12. A method of automatically measuring a magnetic quality of a magnet in a production environment, the method comprising:
generating a generally uniform magnetic field strength within a central volume defined by coils of a magnet measuring component;
energizing the magnet positioned within the central volume, thereby exposing the magnet to a maximum magnetic flux;
measuring the maximum magnetic flux of the magnet positioned within the central volume; and
sorting the magnet into an accepted bin or a rejected bin based on whether the maximum magnetic flux of the magnet satisfies a predetermined maximum magnetic flux threshold.

13. The method of claim 12, wherein a positioning mechanism including a rotating disk is capable of positioning the magnet within the central volume.

14. The method of claim 12, wherein the magnet measuring component is a Helmholtz coil.

15. The method of claim 12, further comprising:
positioning the magnet within the central volume by using a loading system.

16. The method of claim 12, wherein prior to positioning a subsequent magnet within the central volume, the method further comprises:
resetting the magnet measuring component.

17. The method of claim 12, wherein the maximum magnetic flux of the magnet increases as the magnet approach the central volume, and the maximum magnet flux of the magnet decreases as the magnet moves away from the central volume.

18. A method of measuring magnets, the method comprising:
passing each of the magnets through a central volume of a magnet measuring component by using a rotating magnet moving component, wherein the central volume is defined by coils that are energized to generate a generally uniform magnetic field strength, thereby causing each of the magnets that are positioned within the central volume to be exposed to a maximum magnetic flux;
measuring the maximum magnetic flux of each of the magnets that are positioned within the central volume of the magnet measuring component; and
sorting the magnets into appropriate bins based on whether the maximum magnetic flux of each of the magnets satisfy a predetermined maximum magnetic flux threshold.

19. The method of claim 18, wherein the magnets are automatically sorted based on the maximum magnetic flux.

20. The method of claim 18, further comprising:
resetting the magnet measuring component prior to measuring the maximum magnetic flux of a subsequent magnet.

* * * * *